United States Patent [19]

Aucoin et al.

[11] Patent Number: 5,443,647
[45] Date of Patent: Aug. 22, 1995

[54] METHOD AND APPARATUS FOR DEPOSITING A REFRACTORY THIN FILM BY CHEMICAL VAPOR DEPOSITION

[75] Inventors: Thomas R. Aucoin, Ocean; Richard H. Wittstruck, Howell, both of N.J.; Jing Zhao, Ellicott, Md.; Peter A. Zawadzki, Plainfield, N.J.; William R. Baarck, Fair Haven, N.J.; Peter E. Norris, Cambridge, Mass.

[73] Assignee: The United States of America as represented by the Secretary of the Army, Washington, D.C.

[21] Appl. No.: 273,054

[22] Filed: Jul. 11, 1994

Related U.S. Application Data

[63] Continuation of Ser. No. 55,499, Apr. 28, 1993, abandoned.

[51] Int. Cl.⁶ .............................................. C23C 16/00
[52] U.S. Cl. ............................. 118/723 ME; 118/730; 118/723 ER
[58] Field of Search ............... 118/723 MW, 723 ME, 118/723 MR, 723 MA, 723 E, 723 ER, 725, 729, 730, 731, 733

[56] References Cited

U.S. PATENT DOCUMENTS

| | | | |
|---|---|---|---|
| 4,681,773 | 7/1987 | Bean | 118/728 X |
| 4,891,118 | 1/1990 | Ooiwa et al. | 156/345 X |
| 4,989,542 | 2/1991 | Kamo | 118/723 |
| 5,242,530 | 9/1993 | Batey et al. | 156/613 |
| 5,273,588 | 12/1993 | Foster et al. | 118/723 E |
| 5,342,660 | 8/1994 | Cann | 427/577 |

Primary Examiner—R. Bruce Breneman
Assistant Examiner—Joni Y. Chang
Attorney, Agent, or Firm—Michael Zelenka; William H. Anderson

[57] ABSTRACT

The present invention provides for a chemical vapor deposition reactor chamber which is fitted with a rotatable and vertically movable susceptor/wafer carrier. The susceptor/wafer carrier, which is a large diameter disk, provides the reactor with the capability of varying the plasma-substrate distance. As those skilled in the art will appreciate, such a susceptor allows high deposition rates to be achieved for a given power level because the flux of the reactant can be increased due to the high speed rotation which will decrease boundary layer thickness during growth. The ability to adjust the source-substrate distance gives more flexibility than fixed dimensional systems. Further, it allows damage in the thin films to be minimized by simple adjustments to the susceptor/wafer carrier. Because the damage to the thin films is minimized, it makes pulsed operation practical and therefore, the films may be grown in an atomic layer epitaxy mode to produce films of high quality and uniformity.

4 Claims, 1 Drawing Sheet

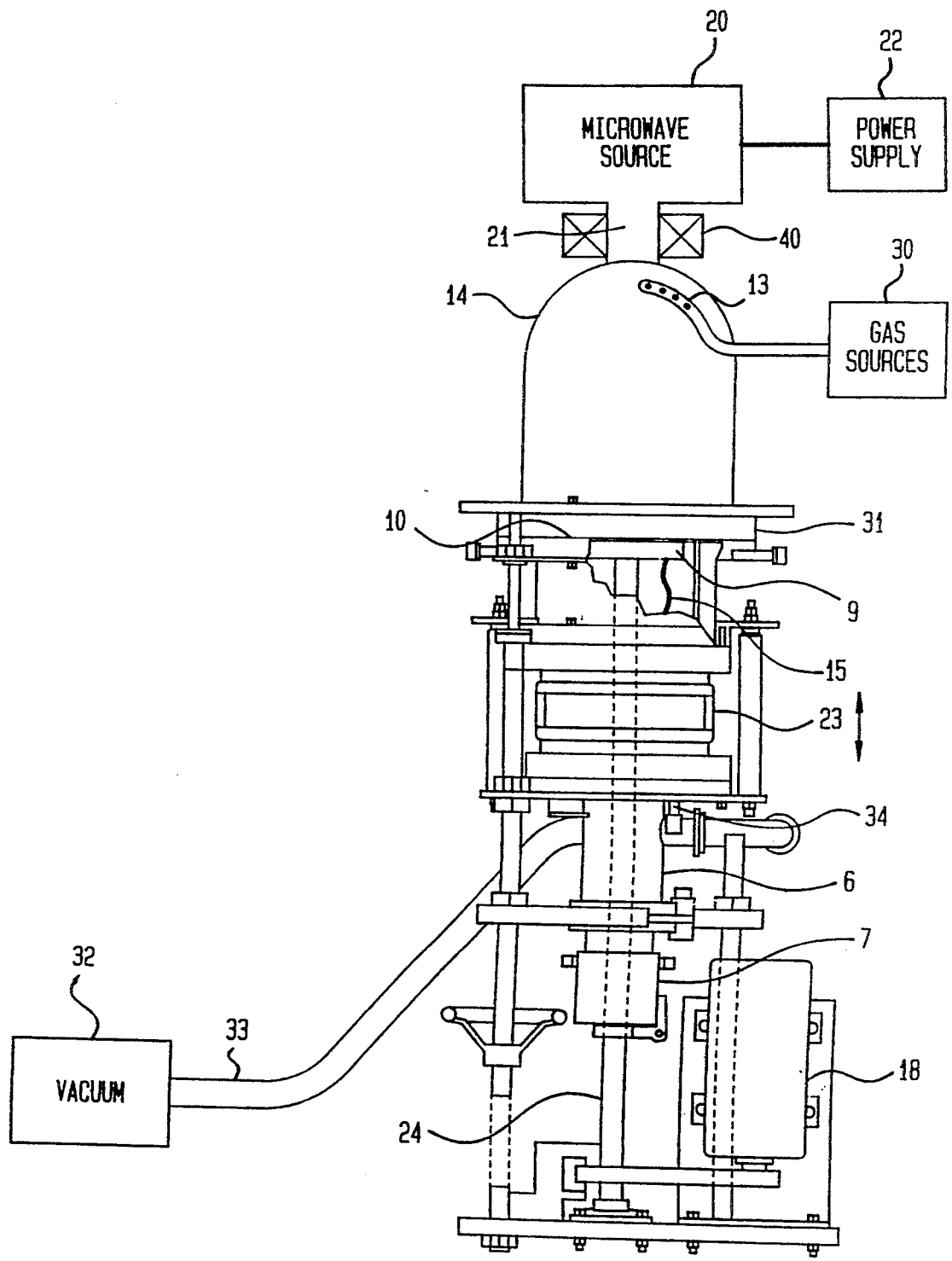

METHOD AND APPARATUS FOR DEPOSITING A REFRACTORY THIN FILM BY CHEMICAL VAPOR DEPOSITION

GOVERNMENT INTEREST

The invention described herein may be manufactured, sold, used, and leased by, or on behalf of, the United States of America without the payment to us of any royalties thereon.

CONTINUATION APPLICATION

This application is a continuation of U.S. patent application Ser. No. 08/055,499, filed Apr. 28, 1993, entitled, "Method and Apparatus for Depositing a Refractory Thin Film By Chemical Vapor Deposition," now abandoned. Priority of this parent application is claimed.

FIELD OF THE INVENTION

This invention relates generally to epitaxy techniques, particularly to the manufacture of thin film coated substrates utilizing chemical vapor deposition, and more particularly to a chemical vapor deposition reaction chamber which can operate in a continuous and a pulsed mode.

BACKGROUND OF THE INVENTION

The process of chemical vapor deposition (CVD) is generally described as the use of chemical reactions to create free product species which condense to form a thin deposit film on a substrate. Several different methods for producing such chemical reactions are well known to those skilled in the art and are disclosed in such treatises as *Microelectronic Materials* by CRM Grovenor, Adam Hilger 1989 and *Growth and Characterization of Semiconductors* by Stradling et al, Adam Hilger 1990. These different CVD methods are used to grow several different species of composite and uniform materials such as III-V semiconductor heterostructures and diamond thin films.

For example, diamond synthesis at low pressures (1-100 Torr) by CVD using hydrocarbon gases has been a subject of great interest over the past two decades. The reason for this interest is that diamond films have a variety of commercial uses such as hard wear resistant coatings, heat sinks which require high thermal conductivity, low dielectric constant coatings for multi-chip modules, as well as having applications in solar blind UV detectors and other high temperature devices such as diodes and transistors. An example of an outline description of diamond synthesis using CVD is found in, "Low Pressure, Metastable Growth of Diamond and 'Diamondlike' Phases," by Angus and Hayman in *Science*, August, 1988, pages 913-921. Since the inception of this technique, a number of chemical vapor deposition techniques have been proposed to grow polycrystalline diamond films; these include: hot filament CVD (HFCVD) (see, U.S. Pat. No. 5,186,973, issued to Garg et al on Feb. 16, 1993), RF plasma assisted CVD, microwave plasma assisted CVD (See Japanese Patent No. SHO 63(1988)-307196 by Kokai, published Dec. 14, 1988), DC plasma assisted CVD (see, "High-Rate Synthesis of Diamond Film by DC Plasma Jet CVD," Koshino et al, *Extended Book of Abstracts, MRS Conference on Diamond and Diamond-like Materials Synthesis*, April 1988), laser assisted CVD, and microwave enhanced CVD (see, U.S. Pat. No. 5,015,494, issued to Yamazaki on May 14, 1991).

For example, microwave enhanced CVD utilizes microwaves to energize a reactive gas into a plasma state by virtue of a magnetic field which functions to contain the plasma gas within the excitation space. With this method, the substrate is held stationary and located at a distance from the excitation space to prevent sputtering. Once the reactive gas is in a plasma state, the plasma is extracted via a divergent magnetic field from the excitation space to a deposition space where the substrate is located. However, because the substrate is held stationary, the type and condition of the substrate directly effects the properties of the diamond film.

Accordingly, because the interface of the substrate and thin film are generally less than what is desirable, these methods have not produced diamond films that are suitable for incorporation into commercial electronic devices. The main problem with these methods is that they do not consistently produce uniform films with the required electrical properties or these methods produce films that are simply too fragile to use in any application.

Similarly, growth of semiconductor heterostructures using CVD has been limited to systems which can only operate in a continuous mode or only in a pulsed mode. Thus, those skilled in the art would readily appreciate a CVD system which can produce reliable commercial grade diamond thin films as well as produce semiconductor heterostructures or thin films in a continuous or pulsed mode. The present invention addresses these needs.

SUMMARY OF THE INVENTION

Accordingly, one object of the present invention is to produce a high growth-rate uniform diamond films, semiconductor heterostructures, or thin films of any type.

Another object of the present invention is to provide for a chemical vapor deposition method which can effectively operate in a pulsed mode, thus additionally providing for a CVD method which has an atomic layer epitaxy mode.

The present invention accomplishes these and other objects by providing for a chemical vapor deposition reactor chamber which is fitted with a rotatable and vertically movable susceptor/wafer carrier. The susceptor/wafer carrier, which is a large diameter disk, provides the reactor with the capability of varying the plasma-substrate distance. As those skilled in the art will appreciate, such a susceptor allows high deposition rates to be achieved for a given power level because the flux of the reactant can be increased due to the high speed rotation which decreases the boundary layer thickness during growth. The ability to adjust the source-substrate distance gives more flexibility than fixed dimensional systems. Further, it allows damage in the thin films to be minimized by simple adjustments to the susceptor/wafer carrier. Because the damage to the thin films may be minimized, it makes pulsed operation practical and therefore, the films may be grown in an atomic layer epitaxy mode to produce films of high quality and uniformity.

BRIEF DESCRIPTION OF THE DRAWING

These and other features of the invention will be more readily understood in light of the Detailed Description of the Invention and the attached drawing wherein:

The FIGURE is schematic representation of a reactor chamber according to the present invention in cross section.

DETAILED DESCRIPTION OF THE INVENTION

Referring now to the FIGURE, there is shown a microwave enhanced CVD reactor chamber according to the present invention. As shown, an injector tube 13 is fed into reactor chamber 14. The injector tube 13 is preferably made of quartz and has laser drilled holes spaced along the portion of the tube which is inside in the reactor chamber. The holes in the injector tube ensure an even distribution of the gases being introduced into the reactor chamber. However, as those skilled in the art will readily recognize the injector tube may be made of any suitable material such as high temperature glass, metal, etc. Moreover, injector tube 13 is merely given as an example of one means of infusing reactant gases into the reactor chamber 14, there being several means available to accomplish this task and still be compatible with the teachings of the present invention.

Mounted above the reactor chamber 14 is a microwave source 20, attendant magnets for focusing the microwave energy 40, electrical circuitry for pulsed power operation (not shown) and power supply 22. The microwave energy is fed into the reactor chamber 14 via duct 21. The microwave plasma necessary for the CVD reaction is produced by microwave energy which is preferably at a maximum of 1.5 kilowatts. The plasma may be cycled on and off for pulsed operation at a rate of once per second to once every several seconds by applying a pulsed signal to the external control of the microwave source power supply in the electronics subsystem. (Although the preferred embodiment includes the use of microwave energy to establish the plasma utilized in the reaction, other means of producing an excitation energy could also be utilized in the present invention. Examples of these other means could be a heat source, RF energy source, DC source or a laser source.)

Susceptor/wafer carrier 10 is rotatably mounted within the reactor chamber 14 on spindle 24. Spindle 24 is guided by the lower spindle bearing assembly and the ferrofluidic feedthru rotary vacuum assembly 7. With this assembly, the susceptor/wafer carrier 10 can be rotated by variable speed motor 18 to speeds of 200–1500 rotations per minute while still maintaining the necessary vacuum in the reactor chamber. The speed of the motor 18 may be controlled by an electronic speed control in the electronics subsystem of the CVD system (not shown).

The susceptor/wafer carrier 10 is heated by convection, conduction and radiation from the heater/heat shield assembly 9. Electrical feed-thrus 15 are attached to a heater/heat shield assembly 9 which, in turn, is attached to the susceptor/wafer carrier 10. The heater is powered by an electrical current flowing to the heater/heat shield assembly 9 the through electrical feedthrus. A power supply in the electronics subsystem supplies the necessary current for the heater/heat shield assembly 9 which is controlled by an electronic temperature controller in the electronics subsystem and a control thermocouple 34 below the bellows assembly 23.

The entire reactor chamber 14 is mounted on a bellows assembly 23 through which electrical feed-thru 15 and spindle 24 are fed. An exhaust nipple 6 and the ferrofluidic rotary vacuum assembly 7 are mounted under the bellows assembly 23. The bellows assembly provides for movement of the rotatable spindle in an vertical direction. The exhaust nipple, exhaust duct 33 and vacuum 32 provide for a means to evacuate reactor chamber 14, load zone 31 and bellows assembly 23. As those skilled in the art readily know a vacuum condition is necessary for the CVD reaction to occur.

In operation, a substrate (typically silicon, or other suitable material depending on the type of reaction that is to take place) is mounted on the susceptor/wafer carrier 10 in load zone 31 and is heated by the heater/heat shield assembly as described above. The reactor chamber is then evacuated by the vacuum 32 to a minimum of $1 \times 10^{-6}$ Torr or higher depending on the desired reaction. Preferably however, the chamber is only evacuated to a pressure in the 1–100 Torr range. Then, hydrogen gas is introduced from a gas source 30 through the quartz injector tube 13. Microwave energy is focused by magnets 40 and is introduced into the reactor chamber 13 to generate a high density microwave plasma of the hydrogen gas. In addition to the introduction of the hydrogen gas, refractory, metal-organic, metal-chloride, and/or other types of precursor gases are forced through the injector tubes 13, out through the laser drilled holes, and into the reactor chamber 13 while the susceptor/wafer carrier is being variably rotated by motor 18.

Typical examples of refractory gases used for the synthesis of diamond thin films include compound carbon gases and/or nitrogen gas or a compound thereof such as ammonia. The specific types of carbon compounds useful in producing diamond thin films include: C1–C4 saturated hydrocarbons such as methane, ethane, propane and butane; C1–C4 unsaturated hydrocarbons such as acetylene, ethylene, propylene and butylene; gases containing carbon and oxygen such as carbon monoxide, and carbon dioxide; aromatic compounds such as benzene, toluene, xylene, and the like; and organic compounds containing carbon, hydrogen and at least one of oxygen and/or nitrogen such as methanol, ethanol, propanol, dimethyl ether, diethyl ether, methylamine, ethylamine, acetone, and similar materials. If a nitrogen compound is used, the typical proportion of the nitrogen compound to the carbon compound is 0.1% to 5%.

As noted previously and although specific reference has only been given to the types of precursor gases for the synthesis of diamond films, the present invention is also useful in the growth of III–V semiconductor thin films and heterostructures either by using III–V metal-chloride precursor gases or III–V metal-organic precursor gases; those skilled in the art would readily be able to configure the present invention for growth of such thin films and heterostructures given the present disclosure. Moreover, those skilled in the art will readily appreciate that the present invention is also useful in the growth or fabrication of other types of thin films, such as superconducting thin films, and therefore, a skilled artisan would also to be able to configure the reactor chamber according to the present invention to accommodate any desired thin film growth.

In the presence of microwave energy discharge and the hot (400°–850° C.) susceptor/wafer carrier 10, the gases react to deposit the desired refractory or semiconductor thin films. The high speed rotation of the susceptor/wafer carrier 10 allows high deposition rates to be achieved for a given plasma power level. This is accomplished by increasing the flux of the reactant to the surface due to the action of the high speed rotation which physically decreases the boundary layer thickness. In other words, the rotation of the susceptor provides for a means to establish a high thermal gradient (or current) which draws the necessary growth precursors from the plasma and down onto the substrate. Therefore, the rotation of the substrate will enhance the nucleation of the as-grown material. (Nucleation means the phenomenon by which crystallographic structures may be grown in a homogeneous and repeatable fashion.)

Moreover, if the plasma is adversely effecting the growth of the thin film, the bellows assembly can be moved vertically so as to move the susceptor/wafer carrier 10 away from the plasma. By providing for a means to vary the distance between the plasma and substrate while maintaining a consistent environment, the quality (or morphology) of the thin film can be optimized at the expense of a lower growth rate. As those skilled in the art will readily recognize, increasing the plasma-substrate distance will result in less plasma damage to the growing film. Furthermore, by being able to adjust the plasma-substrate distance in mid-operation nucleation damage can be minimized, thus, making pulsed operation of the reactor chamber practical. As explained infra, pulsed operation of the reactor chamber at a rate of once per second to once every several seconds can be readily achieved by applying a pulsed signal to the external control of the microwave source power supply in the electronics subsystem. In so doing, thin films may be grown two dimensionally in an Atomic Layer Epitaxy (ALE) mode. Two dimensional growth has been a desired feature for the deposition of refractory thin films, but, to date, has not been achieved. By being able to grow refractory films in an ALE mode, much smoother films will be readily achieved over any three dimensional growth techniques.

Once the thin film has been deposited (typically 1-2 hours, depending on the desired thickness and particular reaction) the substrate is allowed to cool to near room temperature, gas flow and rotation are stopped and the sequence for loading the substrate is reversed.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

What is claimed is:

1. A chemical deposition reactor chamber comprising:
    means for providing excitation energy;
    a reactor chamber connected to said excitation energy means;
    means to infuse reactant gases into the reactor chamber;
    a susceptor/wafer carrier which is rotatably mounted and vertically movable within the reactor chamber;
    means to move said susceptor/wafer carrier vertically with respect to the means for providing excitation energy during chemical deposition of the reactant gases;
    means to rotate said susceptor/wafer carrier during chemical deposition of the reactant gases at a rate of speed within the range of 200 to 1500 rotations per minute;
    means to heat said susceptor/wafer carrier; and
    means to evacuate the reactor chamber to a pressure within the range of 1 to 100 torr.

2. The chemical deposition reactor chamber of claim 1 further including means to pulse the excitation energy and means to pulse the amount and type of reactant gases.

3. The chemical deposition reactor chamber of claim 1 wherein the means to move the susceptor/wafer carrier is a spindel moved by a bellows assembly mounted below the reactor chamber.

4. The chemical deposition reactor chamber of claim 1 wherein the means to rotate the susceptor/wafer carrier is a variable speed motor which is attached to the susceptor/wafer carrier via a spindle and a ferrofluidic rotary vacuum assembly.

* * * * *